(12) United States Patent
Sugawara et al.

(10) Patent No.: US 11,133,333 B2
(45) Date of Patent: Sep. 28, 2021

(54) PRODUCING METHOD FOR THIN FILM TRANSISTOR WITH DIFFERENT CRYSTALLINITIES

(71) Applicant: SAKAI DISPLAY PRODUCTS CORPORATION, Sakai (JP)

(72) Inventors: Yuta Sugawara, Sakai (JP); Masakazu Tanaka, Sakai (JP); Nobutake Nodera, Sakai (JP); Takao Matsumoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/362,266

(22) Filed: Mar. 22, 2019

(65) Prior Publication Data
US 2020/0006394 A1    Jan. 2, 2020

(30) Foreign Application Priority Data

Jun. 28, 2018  (JP) .............................. JP2018-123444

(51) Int. Cl.
*H01L 27/12*  (2006.01)
*H01L 29/786*  (2006.01)
(Continued)

(52) U.S. Cl.
CPC ........ *H01L 27/1229* (2013.01); *G02F 1/1368* (2013.01); *H01L 27/1274* (2013.01);
(Continued)

(58) Field of Classification Search
CPC ............. H01L 27/1229; H01L 27/1274; H01L 29/78669; H01L 29/78678;
(Continued)

(56) References Cited

U.S. PATENT DOCUMENTS 5,563,427 A * 10/1996 Yudasaka .............. H01L 27/127
  257/72
6,020,224 A *  2/2000 Shimogaichi ....... H01L 21/2026
  438/158

(Continued)

FOREIGN PATENT DOCUMENTS

JP     2012-114131 A    6/2012
JP     2012114131 A  *  6/2012
(Continued)

*Primary Examiner* — Eduardo A Rodela
*Assistant Examiner* — Christopher M Roland
(74) *Attorney, Agent, or Firm* — ScienBiziP, P.C.

(57) ABSTRACT

A thin film transistor according to an embodiment of the present invention includes: a gate electrode supported by a substrate; a gate insulating layer covering the gate electrode; a silicon semiconductor layer being provided on the gate insulating layer and having a crystalline silicon region, the crystalline silicon region including a first region, a second region, and a channel region located between the first region and the second region, such that the channel region, the first region, and the second region overlap the gate electrode via the gate insulating layer; an insulating protection layer disposed on the silicon semiconductor layer so as to cover the channel region and allow the first region and the second region to be exposed; a source electrode electrically connected to the first region; and a drain electrode electrically connected to the second region. The channel region is lower in crystallinity than the first region and the second region.

5 Claims, 11 Drawing Sheets

(51) Int. Cl.
    *H01L 29/45*            (2006.01)
    *H01L 29/66*            (2006.01)
    *G02F 1/1368*           (2006.01)
    *G09G 3/36*             (2006.01)
    *H01L 21/02*            (2006.01)
    *H01L 21/20*            (2006.01)

(52) U.S. Cl.
    CPC ........ *H01L 27/1285* (2013.01); *H01L 29/458* (2013.01); *H01L 29/66765* (2013.01); *H01L 29/78606* (2013.01); *H01L 29/78609* (2013.01); *H01L 29/78621* (2013.01); *H01L 29/78669* (2013.01); *H01L 29/78678* (2013.01); *H01L 29/78696* (2013.01); *G02F 2202/103* (2013.01); *G02F 2202/104* (2013.01); *G09G 3/3677* (2013.01); *G09G 3/3688* (2013.01); *H01L 21/0268* (2013.01); *H01L 21/02667* (2013.01); *H01L 21/02675* (2013.01); *H01L 21/2022* (2013.01); *H01L 21/2026* (2013.01)

(58) Field of Classification Search
    CPC ............. H01L 29/78696; H01L 29/458; H01L 29/66765; H01L 29/78606; H01L 21/02667; H01L 21/02675; H01L 21/0268; H01L 21/2022; H01L 21/2026; H01L 27/1285; G02F 1/1368; G02F 2202/103; G02F 2202/104
    See application file for complete search history.

(56) References Cited

U.S. PATENT DOCUMENTS

| | | | |
|---|---|---|---|
| 2002/0100909 A1* | 8/2002 | Yamaguchi | H01L 27/12 257/59 |
| 2005/0218403 A1* | 10/2005 | Kuo | H01L 29/66765 257/59 |
| 2006/0186415 A1* | 8/2006 | Asano | H01L 21/2026 257/72 |
| 2010/0237355 A1* | 9/2010 | Moriguchi | H01L 29/66757 257/72 |
| 2011/0079780 A1* | 4/2011 | Yamayoshi | H01L 29/04 257/57 |
| 2011/0186845 A1* | 8/2011 | Yamayoshi | H01L 21/20 257/59 |
| 2012/0220140 A1 | 8/2012 | Kajiyama et al. | |
| 2012/0313152 A1* | 12/2012 | Yokoi | H01L 29/66742 257/288 |
| 2013/0040414 A1* | 2/2013 | Niira | H01L 31/1824 438/57 |
| 2016/0274699 A1* | 9/2016 | Shishido | G06F 3/0445 |
| 2017/0125606 A1* | 5/2017 | Nunan | H01L 29/78696 |
| 2017/0154901 A1* | 6/2017 | Nodera | H01L 27/1222 |
| 2017/0162709 A1 | 6/2017 | Nodera et al. | |
| 2017/0186783 A1* | 6/2017 | Hu | H01L 29/78678 |
| 2018/0097120 A1 | 4/2018 | Ishida et al. | |
| 2018/0122839 A1 | 5/2018 | Nodera et al. | |
| 2018/0196294 A1* | 7/2018 | Ishida | G02F 1/13454 |
| 2018/0212065 A1* | 7/2018 | Matsushima | H01L 29/786 |
| 2019/0088788 A1* | 3/2019 | Ban | H01L 29/42384 |
| 2019/0140102 A1* | 5/2019 | Matsushima | G02F 1/1368 |
| 2020/0006395 A1* | 1/2020 | Sugawara | H01L 27/1285 |
| 2020/0006396 A1* | 1/2020 | Sugawara | H01L 29/66969 |
| 2021/0036163 A1* | 2/2021 | Ohta | H01L 21/02675 |

FOREIGN PATENT DOCUMENTS

| | | | | |
|---|---|---|---|---|
| JP | 2020004859 A | * | 1/2020 | ......... H01L 27/1274 |
| WO | 2011/055618 A1 | | 5/2011 | |
| WO | 2011/132559 A1 | | 10/2011 | |
| WO | 2016/072024 A1 | | 5/2016 | |
| WO | 2016/157351 A1 | | 10/2016 | |
| WO | 2016/170571 A1 | | 10/2016 | |
| WO | WO-2017046932 A1 | * | 3/2017 | ........ H01L 21/02678 |

* cited by examiner

PRODUCING METHOD FOR THIN FILM TRANSISTOR WITH DIFFERENT CRYSTALLINITIES

BACKGROUND

1. Technical Field

The present invention relates to a thin film transistor, a display apparatus, and a method of producing a thin film transistor.

2. Description of the Related Art

Thin film transistors (TFT) are widely used as switching elements for the respective pixels of a display apparatus, e.g., a liquid crystal display or an organic EL (Electro-Luminescence) display, for example.

A thin film transistor is constructed so that a gate electrode, an insulating layer, a semiconductor layer (channel layer), a source electrode, and a drain electrode are formed on a substrate. Among others, a bottom-gate type thin film transistor is characterized in that the gate electrode is formed closer to the substrate than is the channel layer.

As an example of a bottom-gate type thin film transistor Patent Document 1 (Japanese Laid-Open Patent Publication Mo. 2012-114131) discloses a structure in which an amorphous silicon layer; in a channel section existing between a source electrode and a drain electrode is made polycrystalline by laser annealing technique, for example.

As another example of a bottom-gate type thin film transistor Patent Document 2 (International Publication No. 2016/072024) discloses a structure which is locally subjected to laser annealing so as to leave an amorphous silicon layer in a portion of the channel section, for example.

SUMMARY

Note that a construction as in Patent Document 1, where a channel section existing between a source electrode and a drain electrode is bridged with a polycrystalline silicon layer, has an advantage of enhanced mobility, but also has problems associated with increased OFF current.

On the other hand, a structure as in Patent Document 2, where an amorphous silicon layer is left in a portion of the channel section, has a problem in that an increased resistance in the channel section may lower the OFF current but will also result in a lower mobility.

The present invention has been in view of the above circumstances, and an objective thereof is to provide a thin film transistor in which an OFF current can be lowered while suppressing a decrease in mobility in a channel section existing between a source electrode and a drain electrode, a display apparatus in which the thin film transistor is used, and a method of producing the thin film transistor.

A thin film transistor according to an embodiment of the present invention comprises: a substrate; a gate electrode supported by the substrate; a gate insulating layer covering the gate electrode; a silicon semiconductor layer being provided on the gate insulating layer and having a crystalline silicon region, the crystalline silicon region including a first region, a second region, and a channel region located between the first region and the second region, such that the channel region, the first region, and the second region overlap the gate electrode via the gate insulating layer; an insulating protection layer disposed on the silicon semiconductor layer so as to cover the channel region and allow the first region and the second region to be exposed; a source electrode electrically connected to the first region; and a drain electrode electrically connected to the second region, wherein the channel region is lower in crystallinity than the first region and the second region.

In one embodiment, an average crystal grain size in the channel region is smaller than an average crystal grain size in the first region and the second region.

In one embodiment, the channel region includes microcrystalline silicon; and the first region and the second region include polycrystalline silicon.

In one embodiment, the silicon semiconductor layer further comprises amorphous silicon region.

In one embodiment, a part of the insulating protection layer is located between the silicon semiconductor layer and the source electrode, and another part of the insulating protection layer is located between the silicon semiconductor layer and the drain electrode.

In one embodiment, an angle of inclination of a side face of the insulating protection layer is 60° or more.

In one embodiment, the thin film transistor further comprises: a first contact layer being disposed between the first region and the source electrode and connecting the source electrode and the first region; and a second contact layer being disposed between the second region and the drain electrode and connecting the drain electrode and the second region, wherein the first contact layer and the second contact layer each include an $n^+$ silicon layer containing an n type impurity.

A display apparatus according to one embodiment of the present invention comprises: the thin film transistors of claim 1; and a displaying region having a plurality of pixels, wherein the thin film transistors are respectively disposed in the plurality of pixels.

A method of producing a thin film transistor according to one embodiment of the present invention comprises: step (A) of providing a substrate, the substrate having formed on a surface thereof a gate electrode and a gate insulating layer covering the gate electrode; step (B) of forming a semiconductor film of amorphous silicon on the gate insulating layer; step (C) of forming an insulating film on the semiconductor film, and patterning the insulating film so as to form an insulating protection layer covering a portion of the semiconductor film to become a channel region; step (D) of irradiating the semiconductor film with laser light from above the insulating protection layer to crystallize the semiconductor film so that, in a region overlapping the gate electrode as viewed from a normal direction of the substrate, a portion of the semiconductor film that is covered by the insulating protection layer has a crystallinity which is lower than a crystallinity of a portion of the semiconductor film that is not covered by the insulating protection layer; and step (E) of forming a source electrode which is electrically connected to a part of the portion of the semiconductor film that is not covered by the insulating protection layer and a drain electrode which is electrically connected to another part of the portion of the semiconductor film that is not covered by the insulating protection layer.

In one embodiment, the laser light has a wavelength of about 351 nm, and the insulating protection layer is a silicon oxide layer.

In one embodiment, in step (D), only a portion of the semiconductor film is irradiated with the laser light to be crystallized, while a portion of the semiconductor film that was not irradiated with the laser light is left amorphous.

According to the present application, an OFF current can be lowered while suppressing a decrease in mobility in a channel section existing between a source electrode and a drain electrode.

DETAILED DESCRIPTION

Embodiments of the present invention will be specifically described with reference to the drawings.

Embodiment 1

Figure 1:
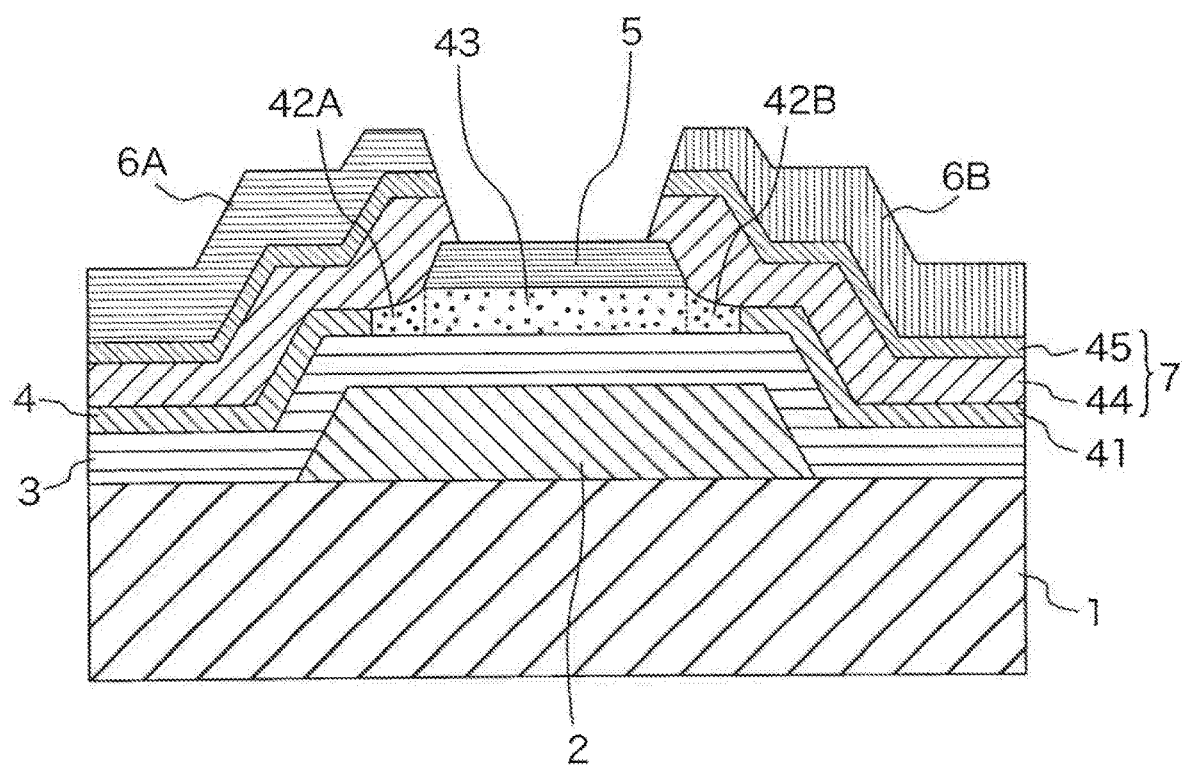
FIG. 1 is a schematic cross-sectional view describing the construction of a thin film transistor according to Embodiment 1.
Figure 2:
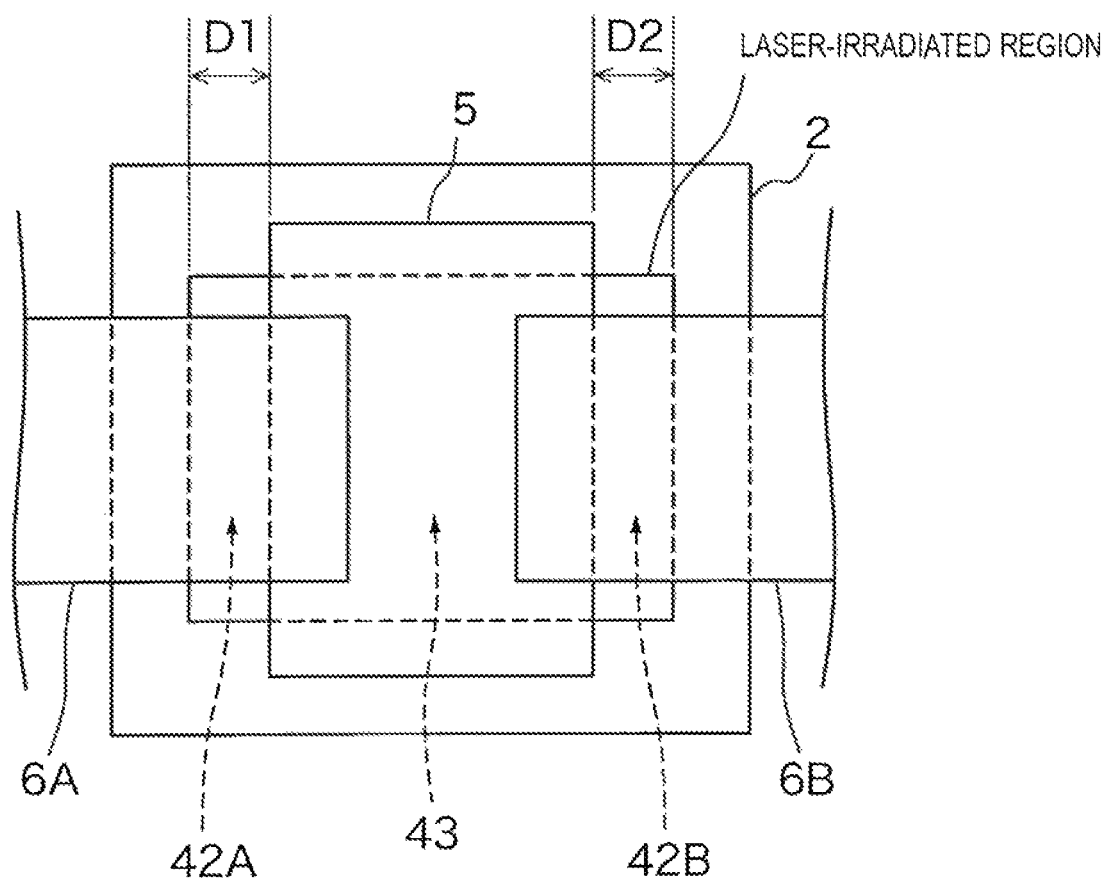
FIG. 2 is a schematic plan view describing the construction of a thin film transistor according to Embodiment 1.

FIG. 1 is a schematic cross-sectional view showing the construction of a thin film transistor according to Embodiment 1, and FIG. 2 is a schematic plan view thereof. A thin film transistor according to Embodiment 1 includes, for example, a gate electrode 2, a gate insulating layer 3, a semiconductor layer 4, a contact layer 7, an etch stop film (insulating protection layer) 5, a source electrode 6A, and a drain electrode 6B. For simplicity, the plan view of FIG. 2 only illustrates the relative positioning between the gate electrode 2, polycrystalline silicon regions 42A and 42B and a microcrystalline silicon region 43 composing the semiconductor layer 4, and the etch stop film 5, while any other constituent elements of the thin film transistor are shown elliptically.

The gate electrode 2, which is an electrode that is patterned on the surface of the substrate 1, can be formed by using a metal such as Al, Kg, Mo, Cr, Ta, Cu, Ti, Mi, W or Mn, an alloy whose main components are any such metals, metal oxides, or other materials, for example. Herein, an insulating substrate such as a glass substrate can be used as the substrate 1.

The gate insulating layer 3 is formed on the substrate 1 so as to cover the gate electrode 2. The gate insulating layer 3 may be an insulating film of an organic substance, or an insulating film of an inorganic substance. As an insulating film of an organic substance, TEOS (tetraethyl orthosilicate) may be used, for example. As an insulating film of an inorganic substance, $SiO_2$, $SiO_2$/SiN, SiN, SiON, $Al_2O_3$, $HfO_2$, or the like can be used, for example.

The semiconductor layer 4 has a first amorphous silicon region 41, polycrystalline silicon regions 42A and 42B, and a microcrystalline silicon region 43. The contact layer 7 includes a second amorphous silicon layer 44 and an $n^+$ silicon layer 45. The first amorphous silicon region 41 is formed on an upper side (i.e., opposite side from the substrate) of the gate insulating layer 3, and has a thickness of e.g. 25 nm or more. Moreover, similarly to the first amorphous silicon region 41, the polycrystalline silicon regions 42A and 42B and the microcrystalline silicon region 43 are also formed on the upper side of the gate insulating layer 3, thus existing within the same layer as the first amorphous silicon region 41.

In the present embodiment, the polycrystalline silicon regions 42A and 42B and the microcrystalline silicon region 43 are formed so as to be inside, in plan view, a region which is defined by the outer edge of the gate electrode 2 (which is a rectangular region in the example shown in FIG. 2; hereinafter the "gate region"). Also in the present embodiment, a region of the semiconductor layer 4 that is covered by the etch stop film 5 is the microcrystalline silicon region 43, whereas the regions flanking the microcrystalline silicon region 43 so that the microcrystalline silicon region 43 is interposed therebetween are respectively the polycrystalline silicon regions 42A and 42B. In other words, in the present embodiment, the region of the semiconductor layer 4 that is covered by the etch stop film 5 has a lower crystallinity than the crystallinity of the two outer regions thereof. Herein, the respective widths D1 and D2 of the regions 42A and 42B, which flank the microcrystalline silicon region 43 so that the microcrystalline silicon region 43 is interposed therebetween and which are not covered by the etch stop film 5, are preferably 3 μm or more each.

Note that the crystallinity (also referred to as "degree of crystallization") of the semiconductor layer 4 can be determined through observation of a cross-sectional shape by using a transmission electron microscope (TEM), for example. For instance, within a diffraction image from a transmission electron microscope, whatever lacks an annular diffraction pattern but only has an obscure halo pattern, or whatever has only a single annular diffraction pattern within a halo pattern, can be distinguished as amorphous. Moreover, within a diffraction image from a transmission electron microscope, whatever has two or more annular diffraction patterns (Debye-Scherrer rings) observed therein may be distinguished as polycrystalline if the number of observed Debye-Scherrer rings is large, or microcrystalline if the number is small.

Crystallinity of the semiconductor layer 4 can also be distinguished through shape measurement of the crystal grains using electron micrographs. For example, in a microcrystalline case, its crystal system may be either a cubic system or a hexagonal system, or may be in a state in which both crystal systems are mixed. Microcrystalline crystal grains may have a size which is not less than 1 nm and not more than 15 nm, preferably not less than 5 nm and not more than 15 nm, and more preferably not less than 10 nm and not more than 15 nm. In a polycrystalline case, it may be an aggregation of crystals with a plurality of surface orientations, or an aggregation of microcrystals which have grown predominantly with a certain surface orientation. Polycrystalline crystal grains may preferably have a size not less than 15 nm and not more than 10 μm.

Furthermore, a crystallization rate may be measured by using Raman spectroscopy. For example, the crystallization rate Xc is calculated as $Xc=(Pc+Pm)/(Pc+Pm+Pa)$. Herein, Pc denotes a peak area of a peak near 520 $cm^{-1}$ in the Raman spectrum, (i.e., a peak area of silicon crystals); Pm denotes a peak area of a peak near 509 $cm^{-1}$ in the Raman spectrum (i.e., a peak area of silicon microcrystals); and Pa denotes a peak area of a peak near 480 $cm^{-1}$ (i.e., a peak area of amorphous silicon). Anything with a measured crystallization rate Xc of 90% or more may be distinguished as polycrystalline; anything with that of less than 90% but not less than 50% as microcrystalline; and anything with that of less than 50% as amorphous.

On the upper side of the first amorphous silicon region 41 and polycrystalline silicon regions 42A and 42B as above, the contact layer 7 is formed. The contact layer 7 may include, for example, the second amorphous silicon layer 44 having a thickness on the order of 50 to 90 nm and an $n^+$ silicon layer 45 being disposed on the second amorphous silicon layer 44 and having a thickness on the order of 10 to 50 nm. The $n^+$ silicon layer 45 is a silicon layer containing impurities such as phosphorus or arsenic at high concentrations.

On the upper side of the microcrystalline silicon region 43, the etch stop film 5 is formed in island shapes. The etch stop film 5 can be formed by using a material such as $SiO_2$, for example. In the present embodiment, the etch stop film 5 being located above the gate electrode 2 is formed so as to cover a partial region (i.e., a region in which the microcrystalline silicon region 43 is formed) of the semiconductor layer 4 inside the gate region.

On the contact layer 7 ($n^+$ silicon layer 45), a source electrode 6A and a drain electrode 6B are formed so as to be apart from each other, the source electrode 6A and the drain electrode 6B having a certain pattern. The source electrode 6A and the drain electrode 6B can be formed by using a metal such as Al, Mg, Mo, Cr, Ta, Cu, Ti, Ni, W or Mn, an alloy whose main components are any such metals, metal oxides, or other materials, for example. In the present embodiment, the source electrode 6A is formed above one polycrystalline silicon region 42A not being covered by the etch stop film 5, whereas the drain electrode 6B is formed above the other polycrystalline silicon region 42B not being covered by the etch stop film 5.

FIG. 3A through FIG. 3D are schematic cross-sectional views describing a method of producing the thin film transistor according to Embodiment 1. First, on the surface of the insulating substrate 1 such as a glass substrate, by sputtering technique, a metal film of e.g. a metal such as Al, Mg, Mo, Cr, Ta, Cu, Ti, Ni, W or Mn, an alloy whose main components are any such metals, metal oxides, or other materials is formed, and through photolithography using a photomask, dry etching of the metal film, delamination of the resist, and cleaning, the gate electrode 2 is patterned.

Next, by conducting film formation with a CVD (Chemical Vapor Deposition) technique using a material such as $SiO_2$ or SiN, for example, the gate insulating layer 3 is formed so as to cover the gate electrode 2 on the substrate 1. The gate insulating layer 3 may be a multilayer film of a material such as $SiO_2$ or SiN, for example.

Figure 3A:
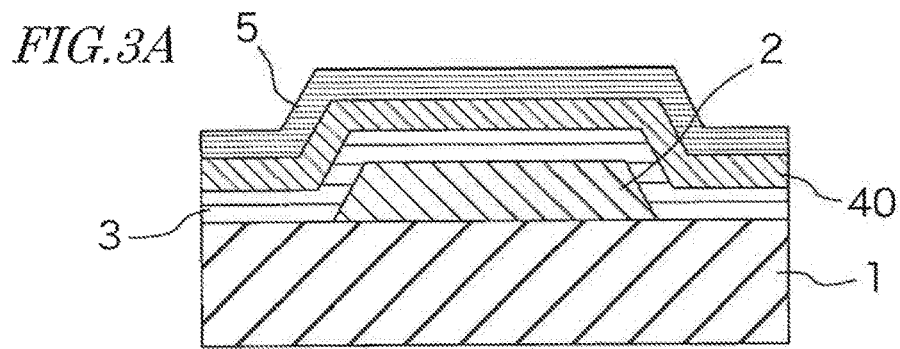
FIG. 3A is a schematic cross-sectional view describing a method of producing the thin film transistor according to Embodiment 1.

Next, by CVD technique, an amorphous silicon film 40 having a thickness on the order of 30 to 100 nm is formed. Moreover, an $SiO_2$ film having a thickness on the order of 100 to 125 nm is formed by CVD technique, whereby the etch stop film 5 is formed on the amorphous silicon film 40. FIG. 3A shows the gate electrode 2, the gate insulating layer 3, the amorphous silicon film 40, and the etch stop film 5 having been formed on the surface of the substrate 1.

Figure 3B:
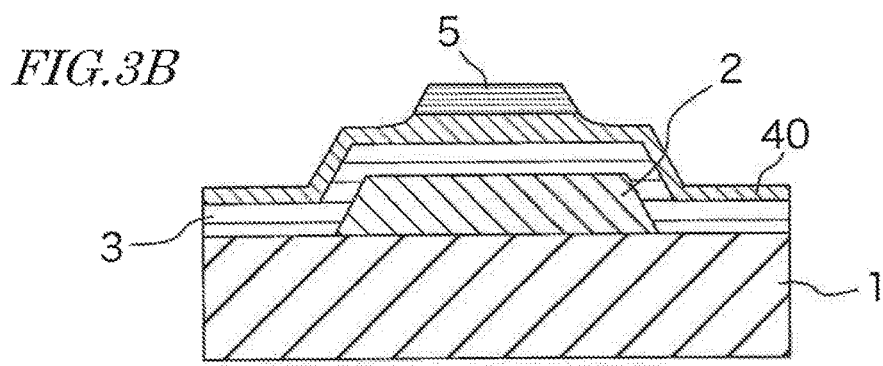
FIG. 3B is a schematic cross-sectional view describing a method of producing the thin film transistor according to Embodiment 1.

Next, dehydrogenation is carried out so as to attain a hydrogen concentration of 2 at % or less in the amorphous silicon film 40, and also photolithography using a photomask, dry etching of the metal film, dry etching of the etch stop film 5, delamination of the resist, and cleaning are carried out, whereby the etch stop film 5 is formed in island shapes. At this point, the amorphous silicon film 40 has a region covered by the etch stop film 5 and regions not covered by the etch stop film 5. The thickness of the region covered by the etch stop film 5 is greater than the thickness of the regions not covered by the etch stop film 5, and may be e.g. 250 Å or more. FIG. 3B shows the etch stop film 5 in having been formed in island shapes on the amorphous silicon film 40.

Next, from the upper side of the etch stop film 5, a region which is inside the gate region in plan view and which is larger than the region defined by the outer edge of the etch stop film 5 is irradiated with laser light (an energy beam), thereby annealing the amorphous silicon film 40. As the laser light used for annealing, an excimer laser using a gaseous mixture of XeF, KrF, XeCl, etc., having a wavelength of 200 to 400 nm, or a solid laser such as YAG (Yttrium Aluminum Garnet) or frequency-tripled laser. The laser light absorption rate of the amorphous silicon film 40 varies with the thickness of the etch stop film 5. In the present embodiment, the thickness of the etch stop film 5 is set from the following standpoints.

Figure 4:
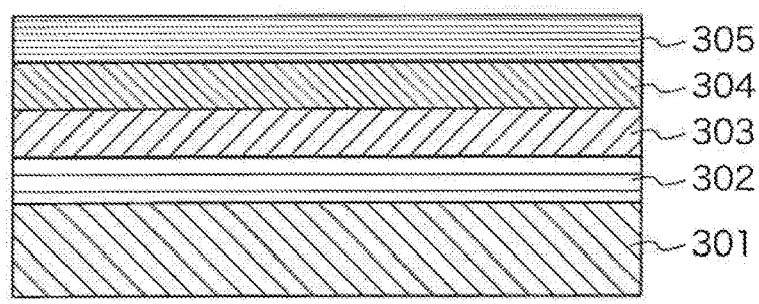
FIG. 4 is a schematic cross-sectional view showing a film structure model used in calculating a laser light absorption rate.
Figure 5:
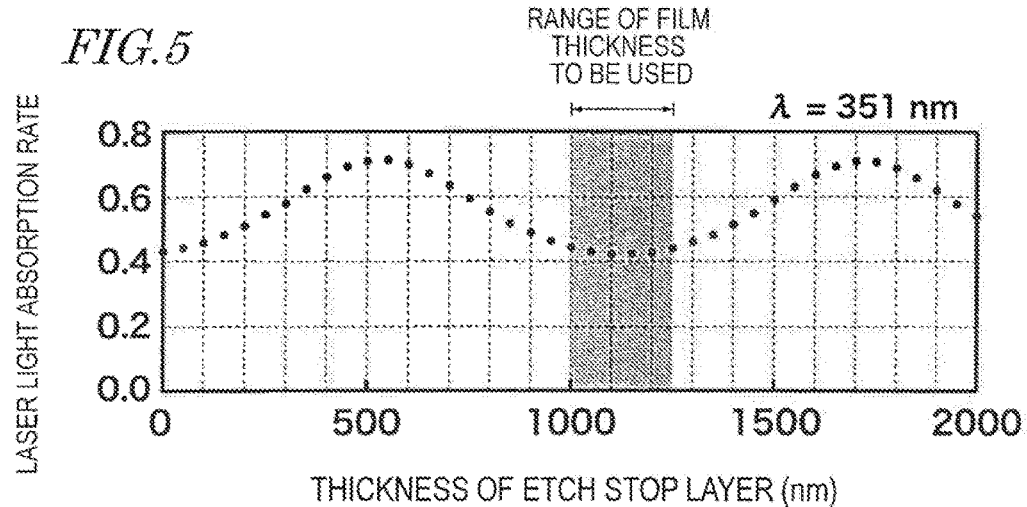
FIG. 5 is a graph showing results of calculating a laser light absorption rate.

FIG. 4 is a schematic cross-sectional view showing a film structure model used in calculating a laser light absorption rate, and FIG. 5 is a graph showing results of calculating the laser light absorption rate. In the present embodiment, a film structure model based on a multilayer film structure of five layers, i.e., the gate electrode 301, the gate insulating layers 302 and 303, the amorphous silicon layer 304, and the etch stop layer 305, is adopted. By taking into consideration the amplitude reflectance and amplitude transmittance at the interfaces between the films, the laser light absorption rate in the amorphous silicon layer was calculated.

The laser light used in calculation had a wavelength of 351 nm. The gate electrode 301 was an Mo film (thickness: arbitrary) having a refractive index of 3.06 and an extinction coefficient of 3.22 with respect to this laser light. The gate insulating layer 302 was an SiN film (thickness: fixed) having a refractive index of 2.1 and an extinction coefficient of 0 with respect to this laser light, and the gate insulating layer 303 was an $SiO_2$ film (thickness: fixed) having a refractive index of 1.48 and an extinction coefficient of 0. The amorphous silicon layer 304 was an amorphous silicon film (thickness: fixed) having a refractive index of 4.5 and an extinction coefficient of 3.42. The etch stop layer 305 was a silicon oxide ($SiO_2$) film (thickness: variable) having a refractive index 1.48 and an extinction coefficient of 0.

By taking into consideration the multiple interference occurring when laser light having a wavelength of 351 nm strikes from a direction which is perpendicular to the surface of the aforementioned film structure model, a laser light absorptance in the amorphous silicon layer 304 was calculated, while varying the thickness of the etch stop layer 305.

The graph shown in FIG. 5 indicates results of calculating the laser light absorption rate in the amorphous silicon layer 304 while varying the thickness of the etch stop layer 305. In the graph, the horizontal axis represents the thickness (nm) of the etch stop layer 305, and the vertical axis represents the laser light absorption rate in the amorphous silicon layer 304. From the results of calculation shown in FIG. 5, it can be seen that the laser light absorption rate in the amorphous silicon layer 304 (corresponding to the amorphous silicon film 40) undergoes periodic changes with respect to the thickness of the etch stop layer 305 (corresponding to etch stop film 5), in an approximate range from 0.4 (local minimum) to 0.7 (local maximum).

In the present embodiment, the thickness of the etch stop film 5 is set by referring to the calculation results in FIG. 5. Specifically, a thickness is set such that the laser light absorption rate in the amorphous silicon film 40 takes a local minimum or a value in the neighborhood of a local minimum (i.e., a value within a predetermined range containing a local minimum).

For example, in the present embodiment, the thickness of the etch stop film 5 is set in a range from 100 to 125 nm so that the laser light absorption rate in the amorphous silicon film 40 will take a value within a predetermined range containing a local minimum, and the etch stop film 5 is formed so as to result in the thickness which has been set. Thereafter, through dry etching, delamination of the resist, and cleaning, the etch stop film 5 is formed into island shapes, followed by irradiation with laser light (excimer laser or solid laser) having the aforementioned wavelength, whereby the amorphous silicon film 40 is annealed and crystallized.

When the thickness of the etch stop film 5 is in a range from 100 to 125 nm, the laser light absorption rate of the amorphous silicon film 40 takes a local minimum or a value in the neighborhood of a local minimum, this being substantially equal to the laser light absorption rate of the case where the etch stop film 5 does not exist (i.e., the thickness being 0). In other words, the laser light absorption rate of the region of the amorphous silicon film 40 that is covered by the etch stop film 5 is substantially equal to the laser light absorption rate of the regions not covered by the etch stop film 5; therefore, by nature, substantially similar levels of thermal energy generation due to laser light absorption should occur in both.

However, in the region that is covered by the etch stop film 5, heat is absorbed by the etch stop film 5, and thus the thermal energy for crystallizing the amorphous silicon decreases; as a result, the crystallinity of the region that is covered by the etch stop film 5 becomes lower than the crystallinity of the regions not covered by the etch stop film 5. Consequently, for example, a portion of the amorphous silicon turns into microcrystalline silicon in the region of the amorphous silicon film 40 that is covered by the etch stop film 5, whereas a portion of the amorphous silicon turns into polycrystalline silicon in the regions not covered by the etch stop film 5.

In the case where the energy of the laser light used for annealing is increased, the polycrystalline silicon having been formed may coagulate, possibly creating within the layer a region or regions (void(s)) where no silicon exists. In the presence of such voids, characteristic variations may occur among individual thin film transistors, possibly causing unevenness in usage as a switching element for a display panel. In the present embodiment, between the region covered by the etch stop film 5 and the regions not covered by the etch stop film 5, the laser light absorption rate in the amorphous silicon film 40 is about the same, and also the heat generation in the region covered by the etch stop film 5 is smaller than in the regions not covered by the etch stop film 5, due to heat absorption by the etch stop film 5. Therefore, in the present embodiment, voids are less likely to occur in the region covered by the etch stop film 5 unless annealing is conducted under conditions that may lead to an excessively high crystallinity in the regions not covered by the etch stop film 5 (i.e., grain size increase).

Figure 3C:
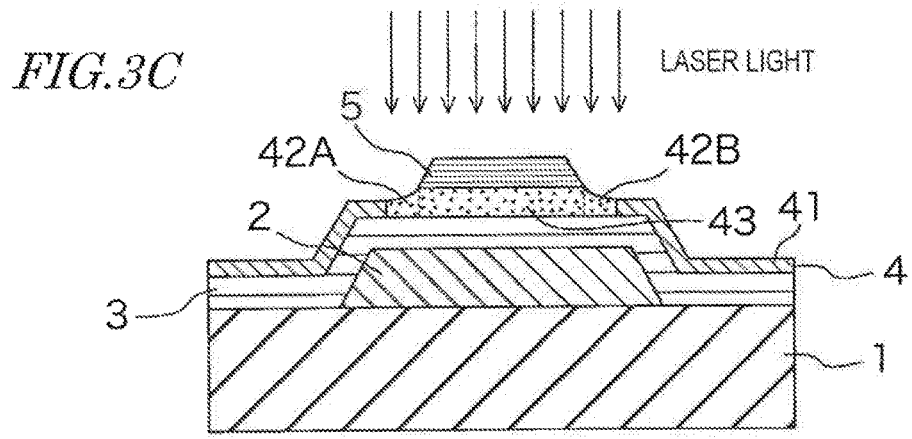
FIG. 3C is a schematic cross-sectional view describing a method of producing the thin film transistor according to Embodiment 1.

By annealing the amorphous silicon film 40 from above the etch stop film 5 using the aforementioned laser light, the microcrystalline silicon region 43 is created in the region of the amorphous silicon film 40 that is covered by the etch stop film 5, and the polycrystalline silicon regions 42A and 42B are created in the regions flanking the microcrystalline silicon region 43 on both sides and not being covered by the etch stop film 5. Any region of the amorphous silicon film 40 which was not irradiated with the laser light, remains amorphous (i.e., the first amorphous silicon region 41). FIG. 3C shows a state where, through annealing with laser light, a semiconductor layer 4 including the first amorphous silicon region 41, polycrystalline silicon regions 42A and 42B, and the microcrystalline silicon region 43 has been formed.

Next, by CVD technique, a film of amorphous silicon having a thickness on the order of 30 to 100 nm is formed, whereby the second amorphous silicon layer 44 is formed. Moreover, by CVD technique, a film of amorphous silicon having a high impurity concentration, e.g., phosphorus or arsenic is formed, whereby the $n^+$ silicon layer 45 having a thickness on the order of 10 to 50 nm is formed or the second amorphous silicon layer 44.

Figure 3D:
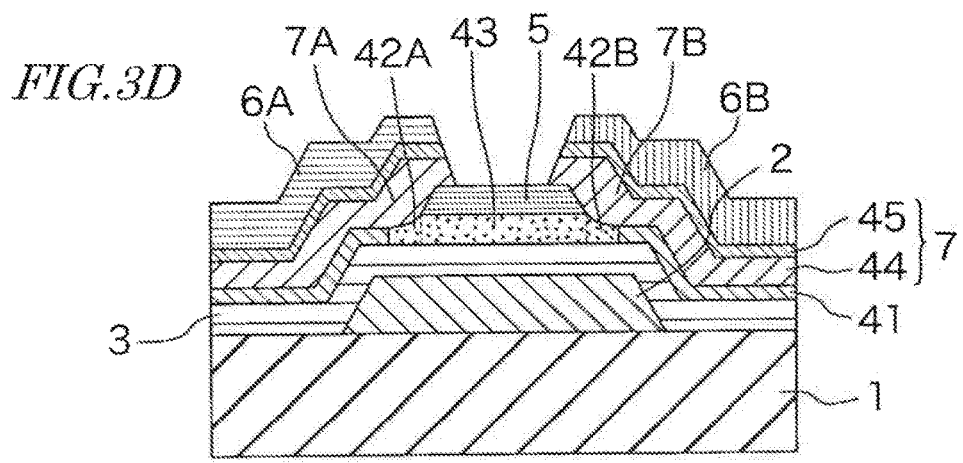
FIG. 3D is a schematic cross-sectional view describing a method of producing the thin film transistor according to Embodiment 1.

Next, by sputtering technique, a metal film of e.g. a metal such as Al, Mg, Mo, Cr, Ta, Cu, Ti, Ni, W or Mn, an alloy whose main components are any such metals, metal oxides, or other materials is formed, and through photolithography using a photomask, dry etching of the metal film, delamination of the resist, and cleaning, the source electrode 6A and the drain electrode 6B are patterned onto the contact layer 7. At this time, the photolithography using a photomask and dry etching of the metal film are performed in such a manner that the source electrode 6A and the drain electrode 6B are apart from each other upon the etch stop film 5, and that a portion of the source electrode 6A is located above the polycrystalline silicon region 42A and a portion of the drain electrode 6B is located above the polycrystalline silicon region 42B. Similarly, the contact layer 7 may also be separated between the source electrode 6A side and the drain electrode 6B side. Within the contact layer 7, a portion 7A connecting the source electrode 6A and the polycrystalline silicon region 42A will be referred to as a first contact layer, and a portion 7B connecting the drain electrode 6B and the polycrystalline silicon region 42B will be referred to as a second contact layer. FIG. 3D shows the source electrode 6A and the drain electrode 6B having been formed.

Next, electrical characteristics of a thin film transistor according to the present embodiment will be described.

Figure 6:
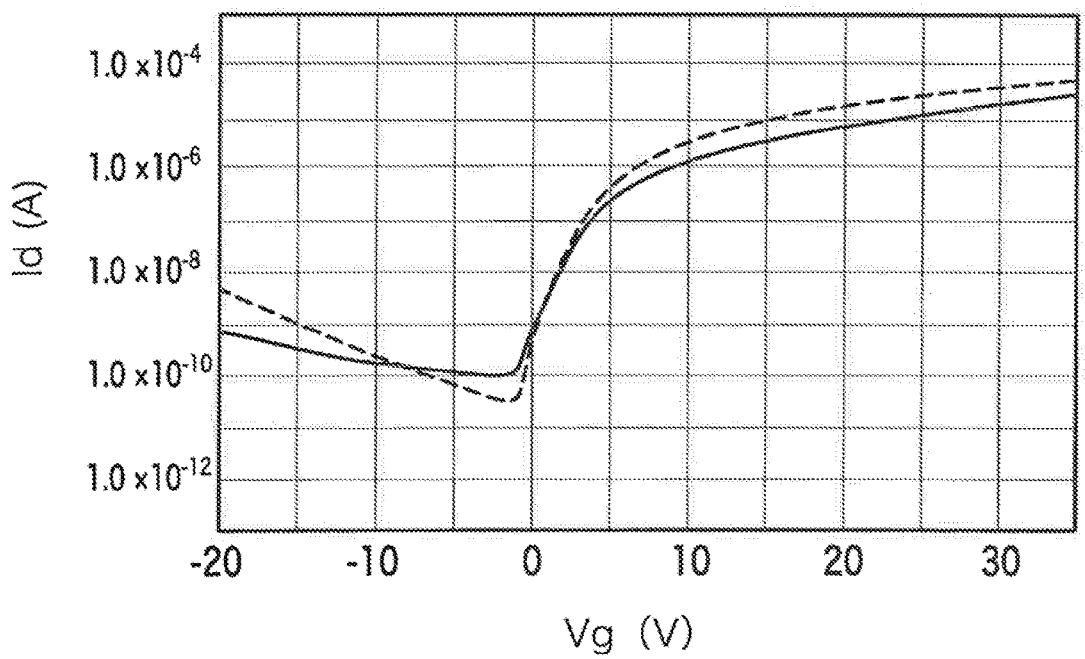
FIG. 6 is a graph showing Vg-Id characteristics of a thin film transistor according to the present embodiment.

FIG. 6 is a graph showing Vg-Id characteristics of a thin film transistor according to the present embodiment. In the graph, the horizontal axis represents the gate voltage Vg(V), and the vertical axis represents the drain current Id(A). The value of the drain voltage Vd is supposed to be 10 V. In FIG. 6, the solid-line graph represents the Vg-Id characteristics of the thin film transistor according to the present embodiment, whereas the broken-line graph represents the Vg-Id characteristics of a thin film transistor according to Comparative Example, of which channel section was composed only of a polycrystalline silicon region.

From the graph shown in FIG. 6, the following electrical characteristics were derived.

(1) The mobility was 6.05 cm$^2$/Vs for Comparative Example, and 3.73 cm$^2$/Vs for the thin film transistor according to the present embodiment.

(2) The subthreshold coefficient was 4.2 V/dec for Comparative Example, and 8.22 V/dec for the thin film transistor according to the present embodiment.

(3) The threshold voltage was 0.89 V for Comparative Example, and 1.28 V for the thin film transistor according to the present embodiment.

(4) The OFF current under a gate voltage of −15 V was $1.03 \times 10^{-9}$ A for Comparative Example, and $3.56 \times 10^{-10}$ A for the thin film transistor according to the present embodiment.

It was found from the above results that the mobility is lower than that of Comparative Example, but still has a value which would be sufficient in forming peripheral driving circuitry of a liquid crystal display panel or the like. It was also found that the OFF current can be reduced by about one digit as compared to Comparative Example.

Thus, in the present embodiment, the channel section between the source electrode 6A and the drain electrode 6B is bridged with the microcrystalline silicon region 43 of low crystallinity and via the polycrystalline silicon regions 42A and 42B of high crystallinity, the resistance in the channel section can be increased, thus allowing the OFF current to be reduced while suppressing a decrease in mobility in the channel section between the source electrode 6A and the drain electrode 6B.

In the present embodiment, the edge of the etch stop film 5 preferably has a steep angle of inclination (e.g. 60 degrees or more).

Figure 7:
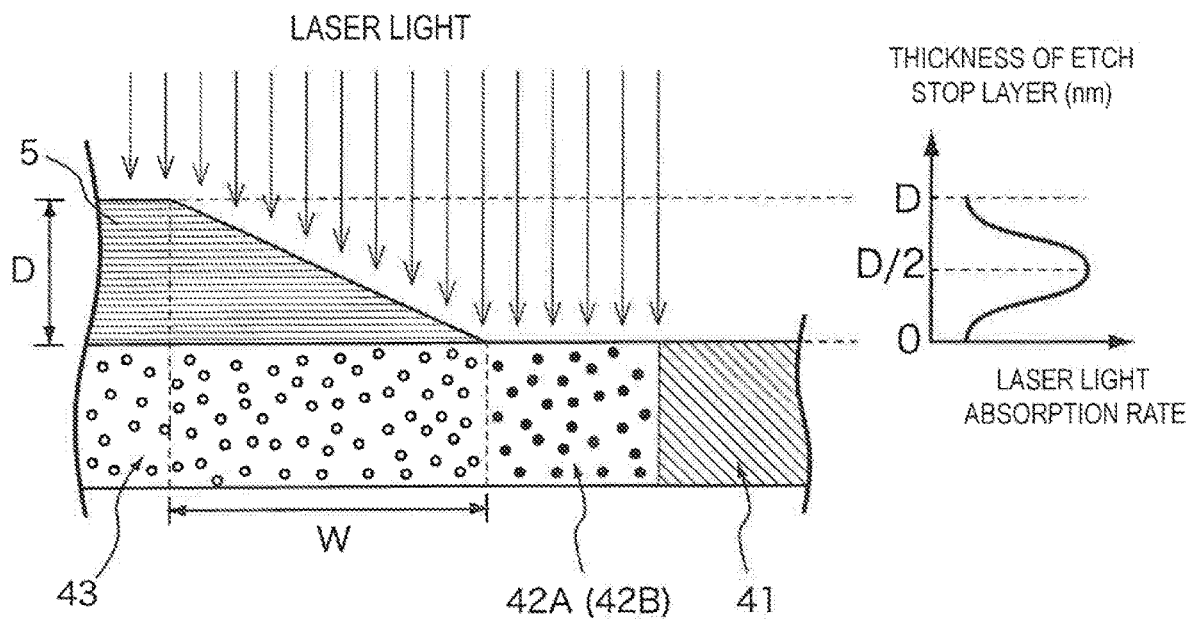
FIG. 7 is an explanatory diagram explaining a relationship between the angle of inclination and the crystallinity of an etch stop film at an edge.

FIG. 7 is an explanatory diagram explaining a relationship between the angle of inclination and the crystallinity of the etch stop film 5 at its edge (side face). As shown in FIG. 7, when the etch stop film 5 has a slanted edge, the thickness of the etch stop film 5 at the edge varies from 0 to D (where D is a predetermined thickness). The region W of varying thickness becomes broader as the angle of inclination of the edge becomes smaller. In the present embodiment, the microcrystalline silicon region 43 and the polycrystalline silicon regions 42A and 42B are formed by subjecting the amorphous silicon film 40 to annealing with laser light. As described above, crystallinity of the microcrystalline silicon region 43 varies with the thickness of the etch stop film 5; therefore, when the region w of varying thickness is broad, a region of high laser light absorptance (i.e., a region having a thickness of D/2) may occur within the region W, possibly causing ablation. From the above, in the present embodiment, the edge of the etch stop film 5 preferably has a steep angle of inclination (e.g., 60 degrees or more). The angle of inclination may also be about 90 degrees or less. Note that, the angle of inclination of the etch stop film 5 can be controlled by adjusting the gas pressure or resist shape during dry etching as appropriate.

Next, variants in which the gate electrode 2, the crystalline silicon region (i.e., laser-irradiated region), and the etch stop film 5 have a different relative positioning from that of Embodiment 1 will be described.

Variant 1

Figure 8:
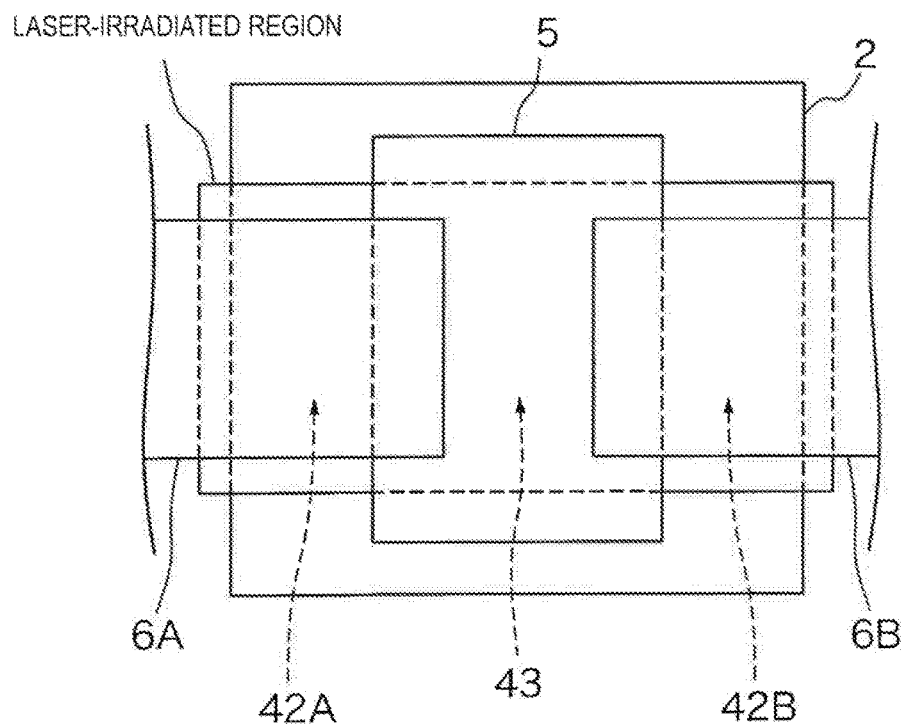
FIG. 8 is a schematic plan view of a thin film transistor according to Variant 1.

FIG. 8 is a schematic plan view of a thin film transistor according to Variant 1. In Variant 1, the crystalline silicon region (i.e., the laser-irradiated region) protrudes out of the gate region. Such a construction is formed by expanding the region irradiated with the laser light to outside of the gate region, during annealing of the amorphous silicon film 40.

Variant 2

Figure 9:
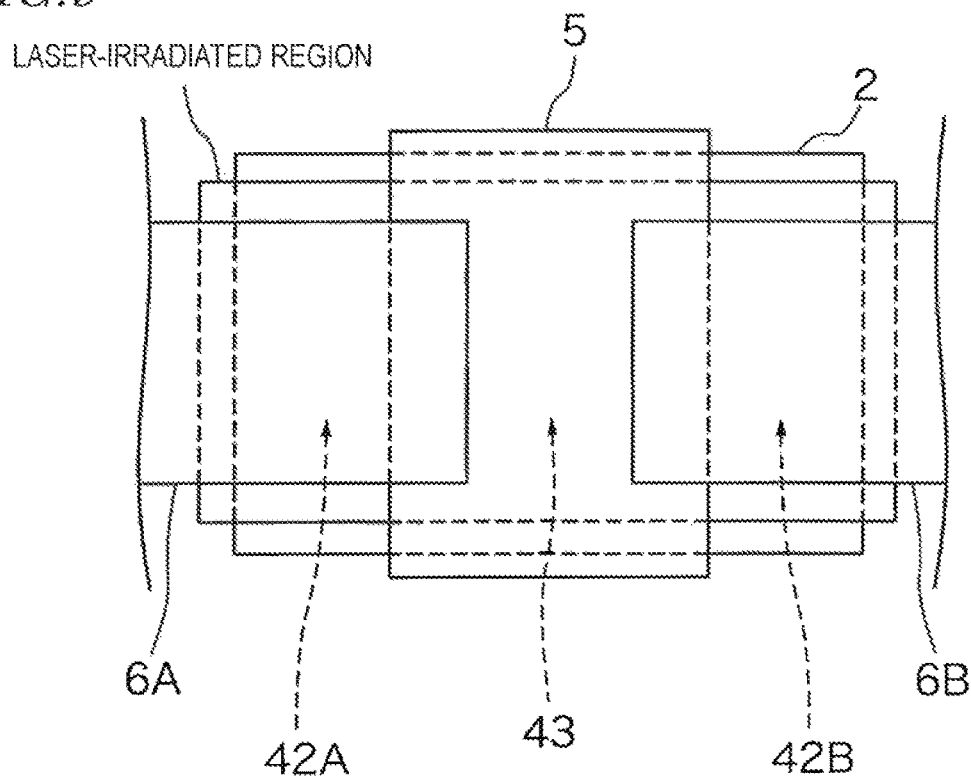
FIG. 9 is a schematic plan view of a thin film transistor according to Variant 2.

FIG. 9 is a schematic plan view of a thin film transistor according to Variant 2. In Variant 2, the crystalline silicon region (i.e., the laser-irradiated region) is formed so as to protrude out of the gate region, and the etch stop film 5 has portions protruding from the gate region. Such a construction is formed by expanding the range of the photomask to outside of the gate region when etching the etch stop film 5, so that portions outside of the gate region will be left. It is also formed by, during annealing of the amorphous silicon film 40, expanding the region irradiated with the laser light to outside of the gate region.

Variant 3

Figure 10:
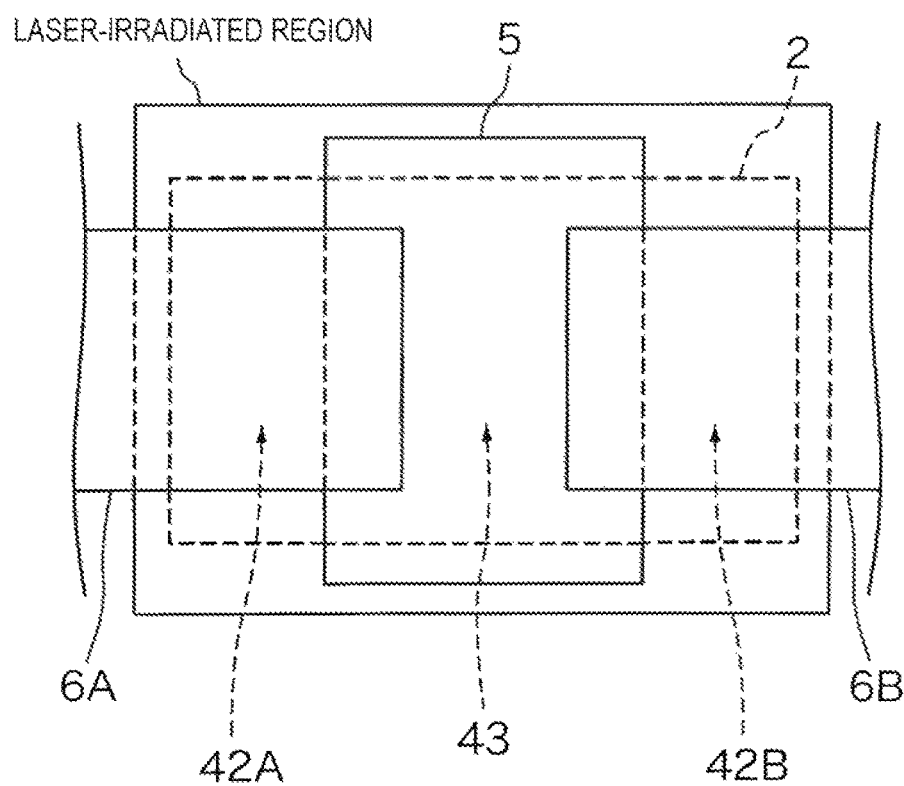
FIG. 10 is a schematic plan view of a thin film transistor according to Variant 3.

FIG. 10 is a schematic plan view of a thin film transistor according to Variant 3. In Variant 3, the etch stop film 5 has portions protruding from the gate region, and the crystalline silicon region (i.e., the laser-irradiated region) protrudes out of the gate region and the region defined by the outer edge of the etch stop film 5. Such a construction is formed by expanding the range of the photomask to outside of the gate region when etching the etch stop film 5, so that portions outside of the gate region will be left. It is also formed by, during annealing of the amorphous silicon film 40, expanding the region irradiated with the laser light to outside of the gate region and the region defined by the outer edge of the etch stop film 5.

Variant 4

Figure 11:
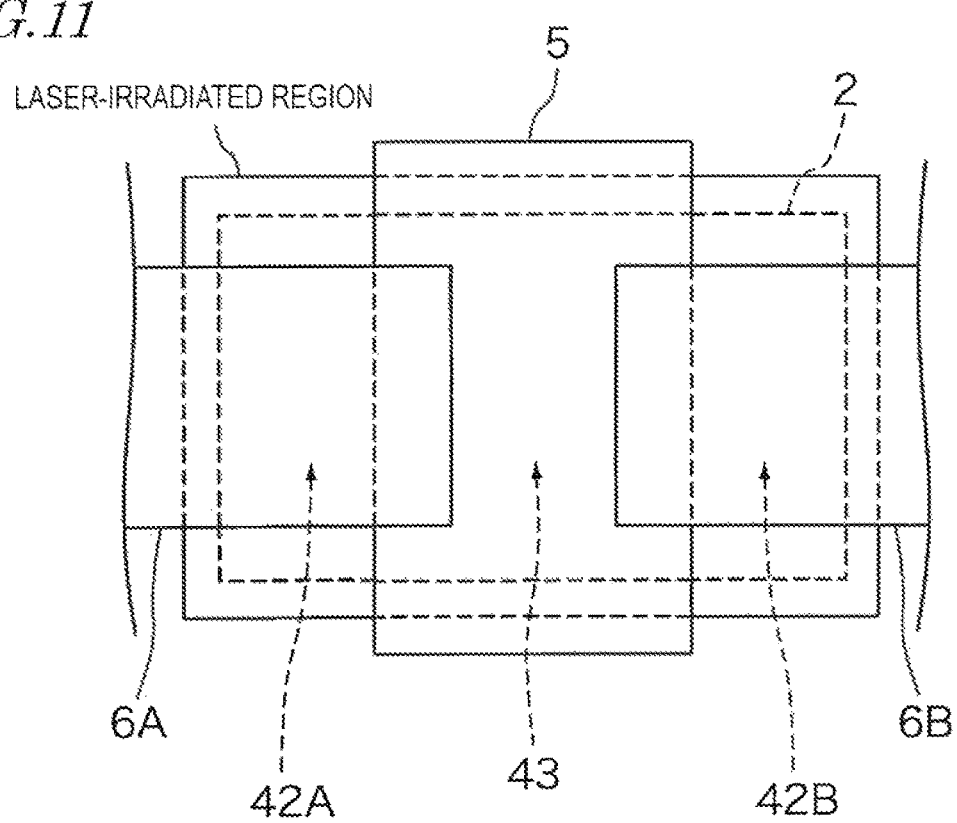
FIG. 11 is a schematic plan view of a thin film transistor according to Variant 4.

FIG. 11 is a schematic plan view of a thin film transistor according to Variant 4. In Variant 4, the crystalline silicon region (i.e., the laser-irradiated region) is formed so as to protrude out of the gate region, and the etch stop film 5 has portions protruding out of the gate region and the crystalline silicon region (i.e., the laser-irradiated region). Such a construction is formed by expanding the range of the photomask to outside of the gate region and the crystalline silicon region (i.e., the laser-irradiated region) when etching the etch stop film 5, such that portions outside of the crystalline silicon region (i.e., the laser-irradiated region) will be left. It is also formed by, during annealing of the amorphous silicon film 40, expanding the region irradiated with the laser light to outside of the gate region.

Variant 5

Figure 12:
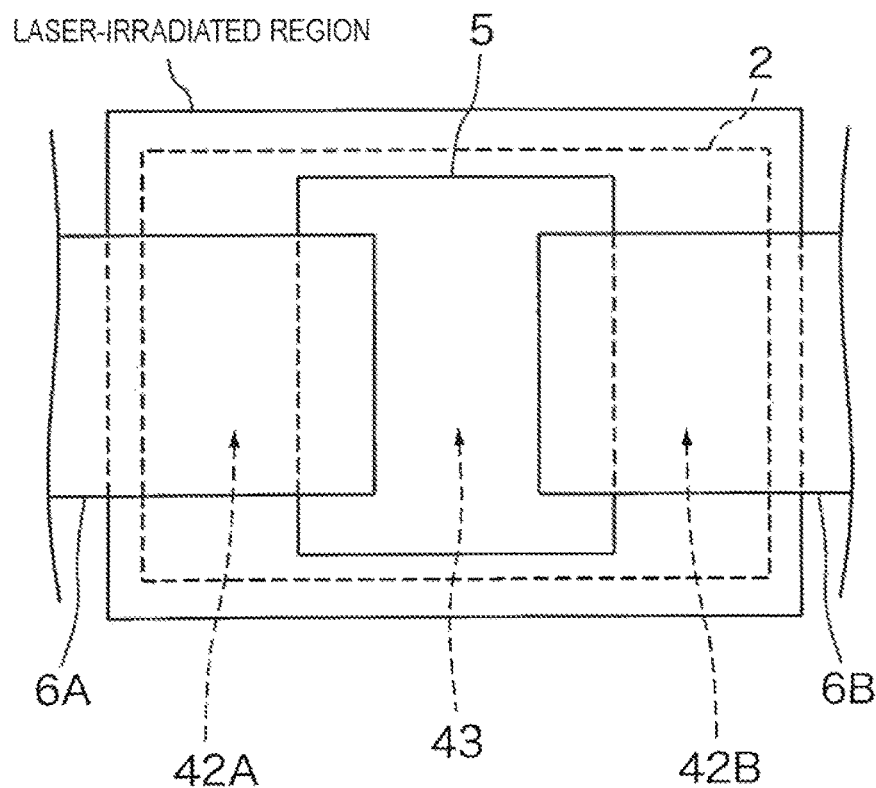
FIG. 12 is a schematic plan view of a thin film transistor according to Variant 5.

FIG. 12 is a schematic plan view of a thin film transistor according to Variant 5. In Variant 5, during annealing of the amorphous silicon film 40, the crystalline silicon region (i.e., the laser-irradiated region) is formed so as to protrude from the gate region, and the etch stop film 5 is formed in a region inside the gate region. Such a construction is formed by forming, restricting the range of the photomask to inside the gate region when etching the etch stop film 5. It is also formed by, during annealing of the amorphous silicon film 40, expanding the region irradiated with the laser light to outside of the gate region.

Embodiment 2

In Embodiment 2, the construction of a display apparatus incorporating the thin film transistor according to the present embodiment will be described.

Figure 13:
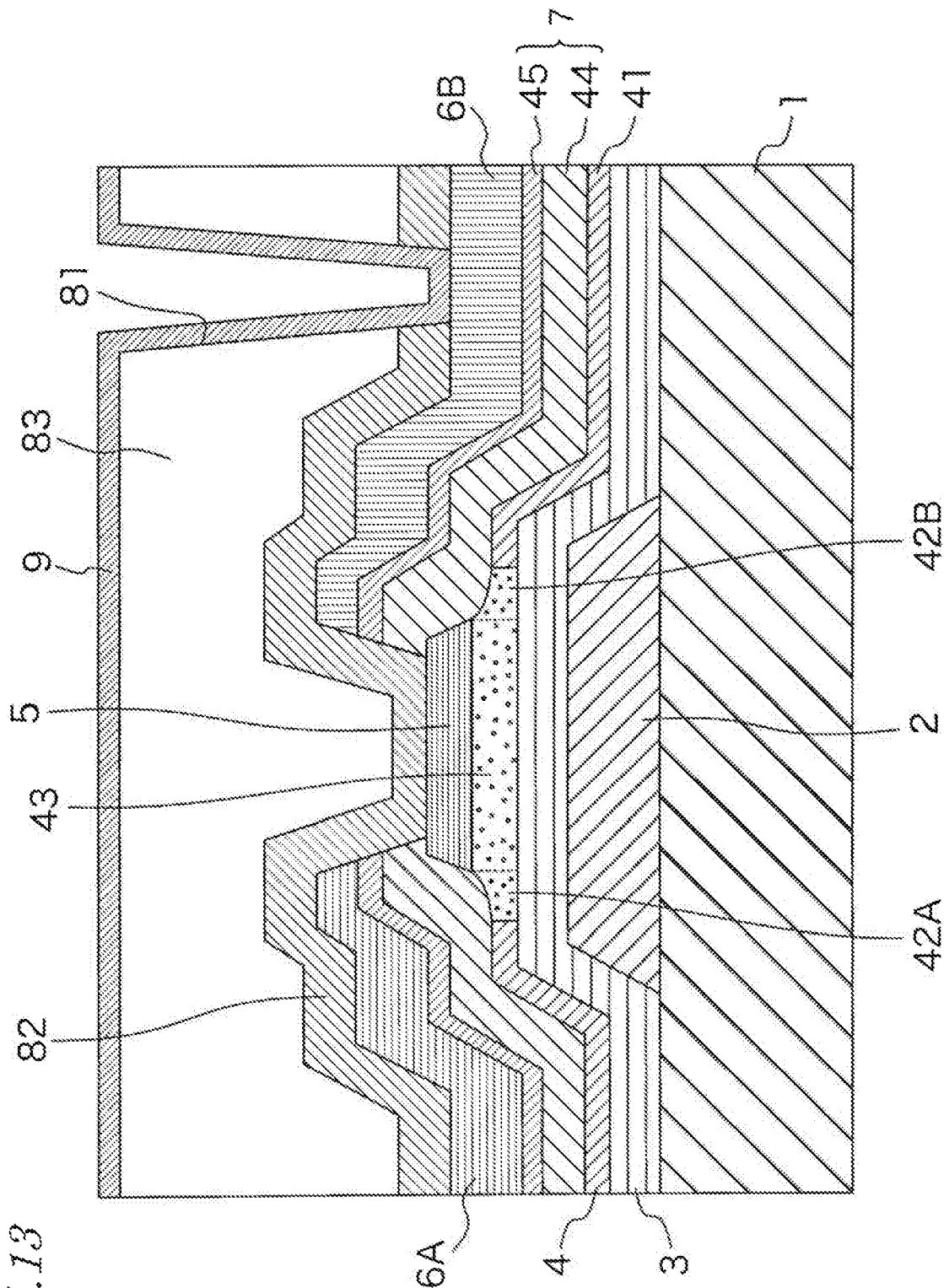
FIG. 13 is a schematic cross-sectional view describing the construction of a thin film transistor according to Embodiment 2.

In the case where the thin film transistor of Embodiment 1 is used as switching elements in a liquid crystal display apparatus, a passivation film 82, an organic film 83, and pixel electrodes 9 are sequentially formed in layers above the source electrode 6A and the drain electrode 6B (see FIG. 13).

FIG. 13 is a schematic cross-sectional view describing the construction of a thin film transistor according to Embodiment 2. The thin film transistor of Embodiment 2 may include, for example, a gate electrode 2, a gate insulating layer 3, a semiconductor layer 4, an etch stop film 5, a contact layer 7, a source electrode 6A and a drain electrode 6B, and a passivation film 82, an organic film 83, and a pixel electrode 9. Note that, the gate electrode 2, the gate insulating layer 3, the semiconductor layer 4, the etch stop film 5, the contact layer 7, the source electrode 6A and the drain electrode 6B are similar in construction to those in Embodiment 1.

The passivation film 82 is formed in a layer above the source electrode 6A and the drain electrode 6B, by using a CVD technique employing SiN or the like, for example. In a layer above the passivation film 82, the organic film 83 of e.g. SOG (Spin-on Glass), made of an acrylic resin, is formed. Thereafter, through patterning with photolithography, dry etching, delamination of the resist and cleaning, a contact hole 81 for the drain electrode 6B is made. In a layer above the organic film 83, an ITO (Indium Tin Oxide) film is formed by sputtering technique, which is then patterned to give the pixel electrode 9.

Figure 14:
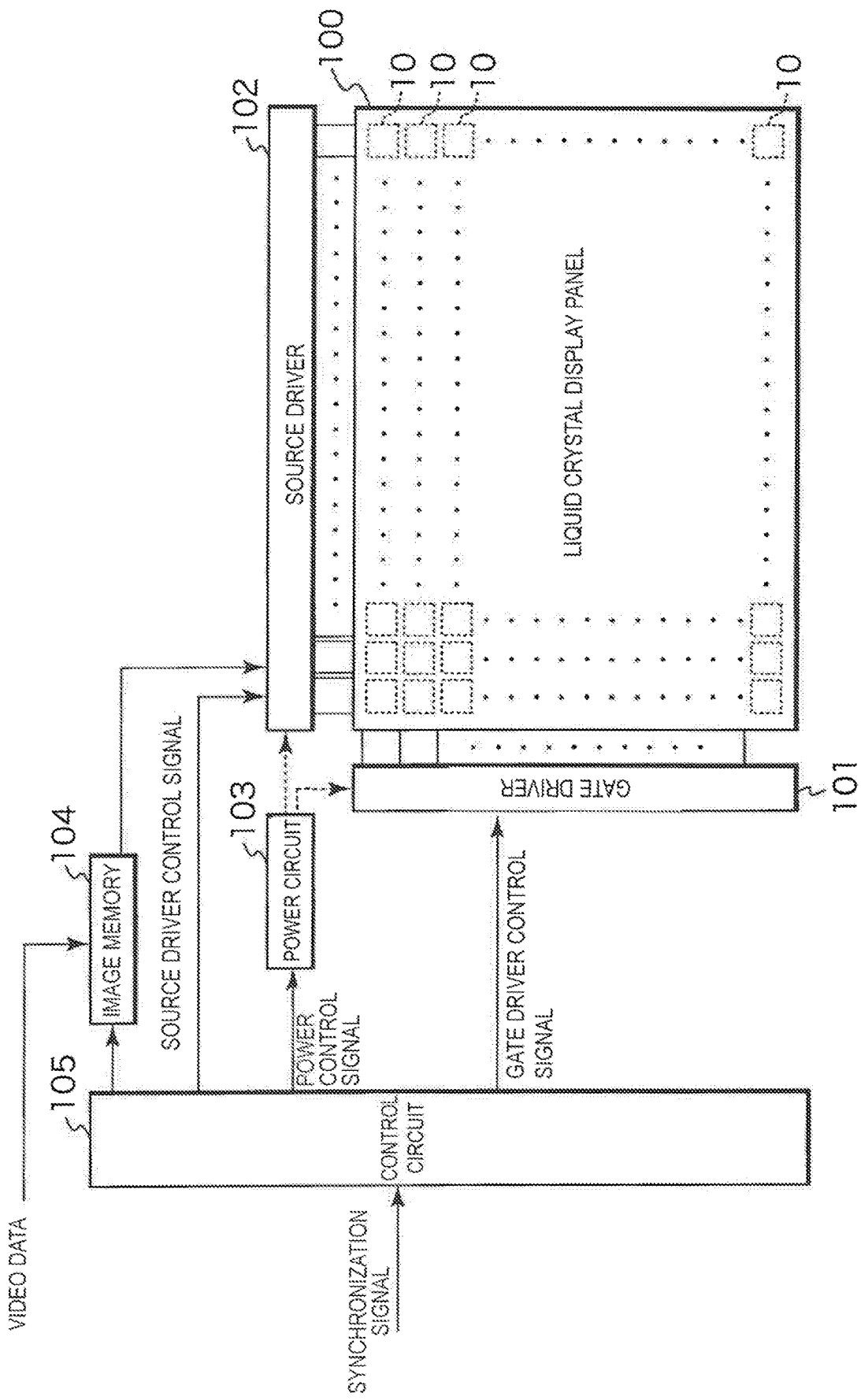
FIG. 14 is a block diagram describing the construction of a display apparatus according to Embodiment 2.

FIG. 14 is a block diagram describing the construction of the display apparatus of Embodiment 2. The display apparatus shown in FIG. 14 represents an exemplary liquid crystal display apparatus, including, for example, a liquid crystal display panel 100, a gate driver 101, a source driver 102, a power circuit 103, an image memory 104, and a control circuit 105.

In synchronization with an externally input synchronization signal, the control circuit 105 outputs control signals with which the gate driver 101, the source driver 102, the power circuit 103, and the image memory 104 are controlled.

The image memory 104 temporarily stores video data to be displayed, and in accordance with a memory control signal which is input from the control circuit 105, outputs the video data to the source driver 102. Note that the image memory 104 may be provided internal to the control circuit 105, so that video data is output to the source driver 102 after internal processing by the control circuit 105.

Based on a power control signal which is input from the control circuit 105, the power circuit 103 generates a driving voltage for the gate driver 101, a driving voltage for the source driver 102, and so on, and supplies these to the gate driver 101 and the source driver 102.

Based on a gate driver control signal which is input from the control circuit 105, the gate driver 101 generates a scanning signal for turning ON/OFF the switching element 11 (see FIG. 15) of each of the pixels that are provided in a matrix shape on the liquid crystal display panel 100, and sequentially applies the generated scanning signal to each gate line that is connected to the gate driver.

Based on a source driver control signal which is input from the control circuit 105, the source driver 102 generates a data signal which is in accordance with the video data that is input from the image memory 104, and sequentially applies the generated data signal to a source line that is respectively connected to the source driver 102. The data signal which is supplied from the source driver 102 via the source line is written to the respective pixel 10 when the corresponding switching element 11 is ON.

Although the present embodiment illustrates a construction where the gate driver 101 and the source driver 102 are provided external to the liquid crystal display panel 100, a construction may be adopted such that the gate driver 101 and the source driver 102 are mounted within the periphery of the liquid crystal display panel 100.

Figure 15:
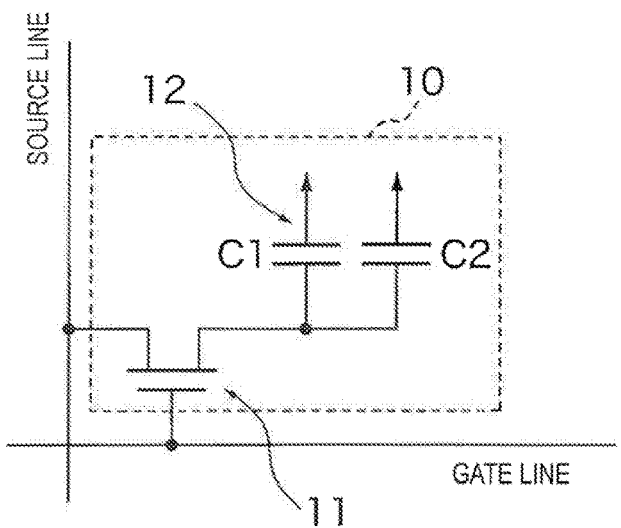
FIG. 15 is a circuit diagram describing an exemplary construction for each pixel.

FIG. 15 is a circuit diagram describing an exemplary construction of a pixel 10. Each pixel 10 includes a switching element 11 and a displaying element 12. The switching element 11 may be a thin film transistor as shown in Embodiment 1, for example, with its source electrode 6A being connected to a source line and its drain electrode 6B being connected to a pixel electrode 9. Moreover, the gate electrode 2 of the switching element 11 is connected to a gate line. The switching element 11 changes its ON/OFF states in accordance with the scanning signal being supplied to the gate line, thus being able to electrically isolate the pixel electrode 9 from the source line, or electrically connect the pixel electrode 9 to the source line.

The liquid crystal display panel 100 includes a counter electrode that is opposed to the pixel electrode 9. A liquid crystal substance is sealed in between the pixel electrode 9 and the counter electrode, whereby a liquid crystal capacitor C1 is created. The counter electrode is connected to a common voltage generation circuit not shown, and as a common voltage Vcom is applied thereto by this common voltage generation circuit, it is maintained at a fixed potential, for example.

Each pixel 10 includes a storage capacitor C2 that is connected in parallel to the liquid crystal capacitor C1, such that, when a voltage is applied to the pixel electrode 9, the charge is also supplied to the storage capacitor C2. Therefore, even during a period when data voltage is not applied via the source line, the pixel 10 is able to retain a voltage value on the basis of the potential that is retained in the storage capacitor C2.

By controlling the magnitude of the voltage that is applied between the pixel electrode 9 and the counter electrode via the gate driver 101, the source driver 102, and the like, and controlling the transmittance of the liquid crystal substance in each pixel 10, the control circuit 105 of the liquid crystal display apparatus adjusts the amount of light transmitted through the liquid crystal substance so as to display an image.

The thin film transistor shown in Embodiment 1 may be adopted as the switching element 11 of each pixel 10, whereby low power consumption can be realized. By adopting the thin film transistor described in Embodiment 1, variation in characteristics between thin film transistors can be suppressed, whereby displaying quality of the liquid crystal display panel 100 can be maintained.

Although Embodiment 2 illustrates a liquid crystal display apparatus as an example display apparatus, the thin film transistor described in Embodiment 1 may be adopted as switching elements for pixel selection, or as switching elements for pixel driving, to be used in an organic EL display apparatus.

The embodiments disclosed herein should be considered in all aspects to be illustrative, rather than restrictive. It is intended that the scope of the present invention is indicated by the claims, rather than bearing the aforementioned meaning, and encompasses any and all possible modifications within the meaning and equivalents of the claims.

Disclosed in addition to the above embodiments are the following notes.

A thin film transistor according to one implementation of the present invention includes: a gate electrode formed on a substrate; a gate insulating layer formed so as to cover the gate electrode; a semiconductor layer formed on the gate insulating layer; and an etch stop film being located above the gate electrode and covering a partial region of the semiconductor layer, wherein the semiconductor layer includes a silicon layer having crystallinity, such that the silicon layer in the partial region covered by the etch stop layer has a lower crystallinity than that of the silicon layer in two regions flanking the partial region so that the partial region is interposed therebetween, the thin film transistor including a source electrode and a drain electrode provided apart from each other on the semiconductor layer, the source electrode being at least partly located above one of the two regions, and the drain electrode being at least partly located above the other one of the two regions.

In a thin film transistor according to one implementation of the present invention, the silicon layer in the partial region is a microcrystalline silicon layer, and the silicon layer in the two regions is a polycrystalline silicon layer.

A thin film transistor according to one implementation of the present invention includes an amorphous silicon layer in the same layer as the microcrystalline silicon layer and the polycrystalline silicon layer.

In a thin film transistor according to one implementation of the present invention, an edge of the etch stop film has an angle of inclination of 60 degrees or more.

A display apparatus according to one implementation of the present invention includes a plurality of displaying elements and the thin film transistor for selecting or driving a displaying element to perform display.

A method of producing a thin film transistor according to one implementation of the present invention involves: forming a gate electrode on a substrate; forming a gate insulating layer so as to cover the gate electrode; forming a semiconductor layer on the gate insulating layer, the semiconductor layer including an amorphous silicon layer; forming an etch stop layer on the semiconductor layer, the etch stop layer having a thickness predetermined so that an absorptance of the amorphous silicon layer with respect to an energy beam to be radiated has a value within a predetermined range containing a local minimum; removing a portion of the etch stop film so that the amorphous silicon layer has two regions where the amorphous silicon layer is not covered by the etch stop film; radiating the energy beam from above the etch stop film to alter crystallinity of the amorphous silicon layer of the semiconductor layer so that the crystallinity of the amorphous silicon layer in a region covered by the etch stop film is lower than the crystallinity of the amorphous silicon layer in the two regions not covered by the etch stop film; and forming a source electrode and a drain electrode provided apart from each other on the semiconductor layer, the source electrode being at least partly located above one of the two regions, and the drain electrode being at least partly located above the other one of the two regions.

Figure 16:
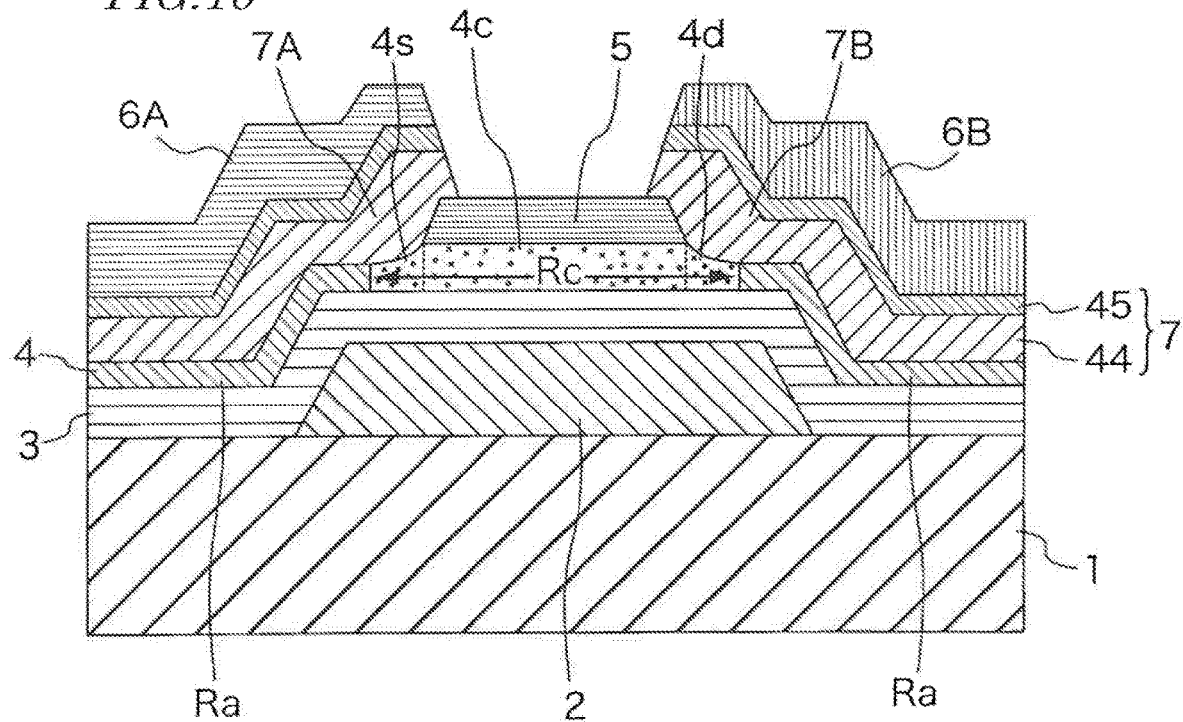
FIG. 16 is a cross-sectional view of a thin film transistor according to an embodiment.
Figure 17A:
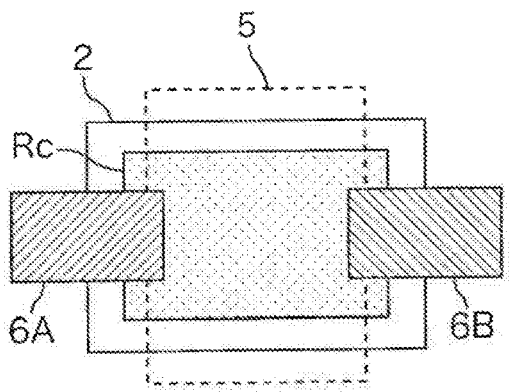
FIG. 17A is a plan view showing still another example of a thin film transistor.
Figure 17B:
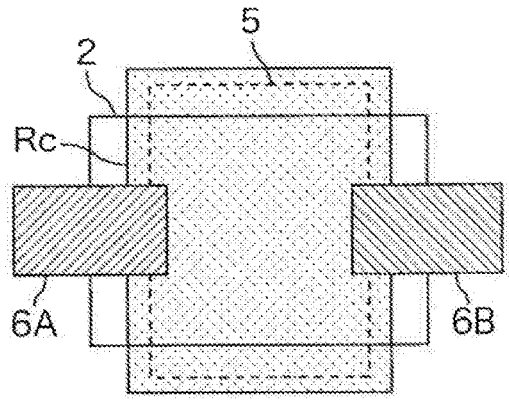
FIG. 17B is a plan view showing still another example of a thin film transistor.
Figure 17C:
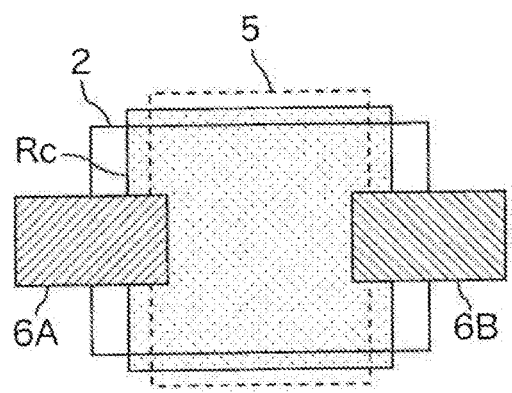
FIG. 17C is a plan view showing still another example of a thin film transistor.
Figure 17D:
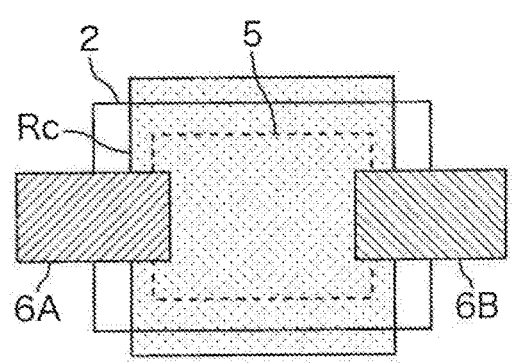
FIG. 17D is a plan view showing still another example of a thin film transistor.
Figure 17E:
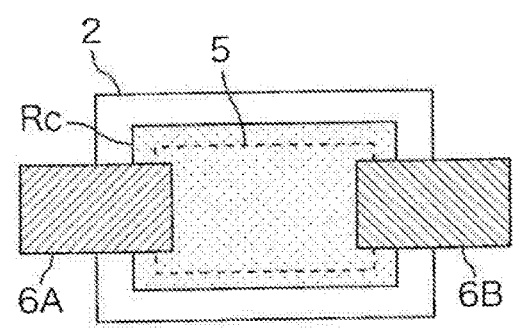
FIG. 17E is a plan view showing still another example of a thin film transistor.
Figure 17F:
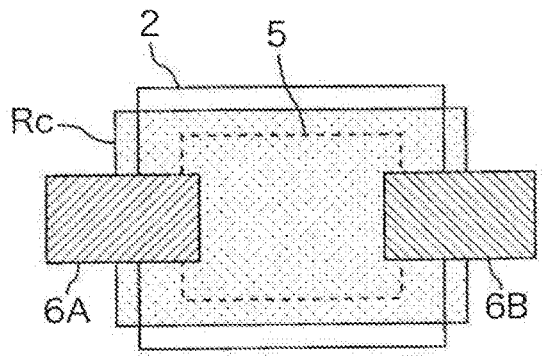
FIG. 17F is a plan view showing still another example of a thin film transistor.

With reference to FIG. 16, the construction of a thin film transistor according to one implementation of the present invention will be further described.

The thin film transistor includes: a substrate 1, a gate electrode 2 supported on the substrate 1; a gate insulating layer 3 covering the gate electrode; a semiconductor layer (silicon semiconductor layer) 4 provided on the gate insulating layer 3, the semiconductor layer having a crystalline silicon region Rc; an insulating protection layer (also referred to as an etch stop layer) 5 disposed on a portion of the semiconductor layer 4, and a source electrode 6A and a drain electrode 6B.

In the present specification, the "crystalline silicon region Rc" is a region mainly containing crystalline silicon (including polycrystalline silicon, microcrystalline silicon, and single-crystalline silicon).

The crystalline silicon region Rc includes a first region 4s, a second region 4d, and a channel region 4c located between the first region 4s and the second region 4d. The first region 4s is a region (source contact region) that is electrically connected to the source electrode 6A. The second region 4d is a region (drain contact region) that is electrically connected to the drain electrode 6B. In the present embodiment, the channel region 4c, the first region 4s, and the second region 4d overlap the gate electrode 2 via the gate insulating layer 3.

The insulating protection layer 5 is disposed on the semiconductor layer 4 so as to cover the channel region 4c while exposing the first region 4s and the second region 4d. The insulating protection layer 5 may be in contact with an upper face of the channel region 4c. In the illustrated example, the insulating protection layer 5 has an island shape. The insulating protection layer 5 may have an aperture which is formed so as to cover the entire semiconductor layer 4 and through which the first region 4s of the semiconductor layer 4 is exposed and an aperture through which the second region 4d is exposed.

In a step (source-drain separation step) of patterning the electrically conductive film to form the source electrode 6A and the drain electrode 6B, the insulating protection layer 5 functions as an etch stop layer for protecting the channel region 4c. In other words, the insulating protection layer 5 is formed in a layer below the electrically conductive film (i.e., after the semiconductor layer 4 is formed before the electrically conductive film for the source and drain electrodes is formed). Therefore, a part of the insulating protection layer 5 is located between the semiconductor layer 4 and the source electrode 6A (in this example, between the semiconductor layer 4 and the first contact layer 7A), whereas another part of the insulating protection layer 5 is located between the semiconductor layer 4 and the drain electrode 6B (in this example, between the semiconductor layer 4 and the second contact layer 7B).

In the present embodiment, crystallinity of the channel region 4c of the crystalline silicon region Rc is lower than the crystallinity of the first region 4s and the second region 4d. As described earlier, such a crystal structure may be produced by forming the insulating protection layer 5 on a portion of the amorphous silicon film and thereafter performing a crystallization step of radiating laser light from above the insulating protection layer 5, thereby controlling the laser light absorptance associated with the portion of the semiconductor film that is covered by the insulating protection layer 5 (i.e., reflectance of laser light by the multilayer structure including the insulating protection layer 5).

In one example, an average crystal grain size in the channel region 4c may be smaller than an average crystal grain size in the first region 4s and the second region 4d. Alternatively, a crystallization rate in the channel region 4c as measured by using Raman spectroscopy may be smaller than a crystallization rate in the first region 4s and the second region 4d. In other words, the volumetric ratio of the amorphous phase contained in the channel region 4c may be greater than the volumetric ratio of the amorphous phase contained in the first region 4s and the second region 4d.

The channel region 4c, the first region 4s, and the second region 4d may each contain polycrystalline silicon. Alternatively, these regions may each contain microcrystalline silicon. Alternatively, the channel region 4c may contain microcrystalline silicon, while the first region 4s and the second region 4d may contain polycrystalline silicon.

In addition to the crystalline silicon region Rc, the semiconductor layer 4 may further have an amorphous silicon region Ra. For example, when only a portion of the amorphous silicon film is irradiated with laser light to be crystallized, the region irradiated with the laser light becomes the crystalline silicon region Rc, while the region not irradiated with the laser light remains as the amorphous silicon region Ra. For such a crystallization method, the entire disclosure of International Publication No. 2011/055618, International Publication No. 2011/132559, International Publication No. 2016/157351, and International Publication No. 2016/170571, for example, is incorporated herein by reference.

The thin film transistor may further include a first contact layer 7A which is disposed between the first region 4s and the source electrode 6A to connect the source electrode 6A and the first region 4s, and a second contact layer 7B which is disposed between the second region 4d and the drain electrode 6B to connect the drain electrode 6B and the second region 4d. The first contact layer 7a and the second contact layer 7B (hereinafter collectively referred to as the "contact layer 7") each contain an n type impurity. An $n^+$ silicon layer 45 containing the n type impurity may be an amorphous silicon layer, or a crystalline silicon layer. An upper face of the $n^+$ silicon layer 45 may be directly in contact with the source electrode 6A or the drain electrode 6B. The respective $n^+$ silicon layers 45 in the first contact layer 7A and the second contact layer 7B are disposed apart from each other.

The contact layer 7 may have a multilayer structure including the $n^+$ silicon layer 45 and a second amorphous silicon layer 44 disposed on the substrate 1 side of the $n^+$ silicon layer 45. The second amorphous silicon layer 44 may foe intrinsic (i.e., containing substantially no impurities), or contain an impurity at a concentration lower than that in the $n^+$ silicon layer 45. A lower face of the second amorphous silicon layer 44 may be directly in contact with the first region 4s or the second region 4d. Although the respective $n^+$ silicon layers 45 in the first contact layer 7A and the second contact layer 7B are disposed separate from each other, the respective second amorphous silicon layers 44 in the first contact layer 7A and the second contact layer 7B may not be separate (i.e., may be connected above the insulating protection layer 5).

The contact layer 7 may be a single $n^+$ silicon layer 45. In this case, a lower face of the $n^+$ silicon layer 45 may be directly in contact with the first region 4s or the second region 4d.

As described above, the angle of inclination of a side face of the insulating protection layer 5 (i.e., the angle between the lower face and the side face of the insulating protection layer 5) may be e.g. 60° or more. Moreover, the angle of inclination may be 90° or less. In the case where the insulating protection layer 5 does not have an island shape, but is formed so as to cover the entire semiconductor layer 4 and has apertures each exposing the first region 4s and the second region 4d of the semiconductor layer 4, the angle of inclination of the side face of the insulating protection layer 5 refers to an angle between the lower face of the insulating protection layer 5 and the inner wall surface of each aperture.

Moreover, a thin film transistor according to the present embodiment may be produced as follows, for example.

First, on the substrate 1, the gate electrode 2 and the gate insulating layer 3 covering the gate electrode 2 are formed. Next, on the gate insulating layer 3, a semiconductor film 40 (amorphous silicon film 40) composed of amorphous silicon is formed. Then, on the semiconductor film 40, an insulating film to become the insulating protection film is formed, and the insulating film is patterned to give the insulating protection layer 5 covering a portion of the semiconductor film 40 to become the channel region (see FIG. 3B).

Thereafter, the semiconductor film 40 is irradiated with laser light from above the insulating protection layer 5, thereby being crystallized in such a manner that, in a region that overlaps the gate electrode 2 as viewed from the normal direction of the substrate 1, a portion of the semiconductor film 40 that is covered by the insulating protection layer 5 has a crystallinity which is lower than the crystallinity of the portion that is not covered by the insulating protection layer 5. As a result of this, the region which was laser-irradiated becomes crystallized, whereby the semiconductor layer 4 having the crystalline silicon region Rc is obtained.

Next, the source electrode 6A, which is electrically connected with a part (which herein is the first region 4s) of the portion of the crystalline silicon region Rc that is not covered by the insulating protection layer 5, and the drain electrode 6B, which is electrically connected with another part, (which herein is the second region 4d) of the portion of the crystalline silicon region Rc that is not covered by the insulating protection layer 5, are formed. In this manner, the thin film transistor is produced.

According to the present embodiment, portions of the semiconductor layer (active layer) 4 of the thin film transistor to serve as a path for a current flowing between the source electrode 6A and the drain electrode 6B (i.e., the first region 4s, the second region 4d, and the channel region 4c) are composed of crystalline silicon, whereby a decrease in mobility of the thin film transistor can be suppressed. Moreover, the crystal Unity of the portion to serve as a current path is lowered locally (e.g., herein, the crystallinity of the channel region 4c is lowered), whereby the OFF current can be reduced. As a result, the OFF characteristics can be enhanced while ensuring desired ON characteristics.

Moreover, when a thin film transistor is produced by the above-described method, after patterning the insulating protection film to form the insulating protection layer 5, the semiconductor film 40 is irradiated with laser light from above the patterned insulating protection layer 5 in order to effect laser annealing. Thus, crystallinity can be differentiated between the portion that is covered by the insulating protection layer 5 and the portion(s) not covered by the insulating protection layer 5, within the semiconductor film 40. That is, by using the insulating protection layer 5, it is possible to selectively form regions with different levels of crystallinity, without having to perform laser annealing a plurality of times under different irradiation conditions.

The relative positioning between the gate electrode 2, the insulating protection layer 5, and the crystalline silicon region Rc (i.e., the region irradiated with laser light), as viewed from the normal direction of the substrate 1, is not limited to the examples illustrated in FIG. 1 and FIG. 8 through FIG. 12. FIG. 17A through FIG. 17F are plan views showing still other examples of the thin film transistor. For example, exemplary arrangements illustrated in FIG. 17A through FIG. 17F are possible. In all these exemplary arrangements, the insulating protection layer 5 is disposed so as to overlap only a portion of the gate electrode 2. Moreover, the crystalline silicon region Rc is disposed so as to at least partly overlap the gate electrode 2. The crystalline silicon region Rc includes a portion overlapping both of the gate electrode 2 and the insulating protection layer 5 and a portion that overlaps the gate electrode 2 but does not overlap the insulating protection layer 5.

For example, as viewed from the normal direction of the substrate 1, the insulating protection layer 5 may extend so as to traverse the crystalline silicon region Rc along the channel width direction of the thin film transistor. Alternatively, the insulating protection layer 5 may have an island shape, and be located inside the crystalline silicon region Rc as viewed from the normal direction of the substrate 1. The crystalline silicon region Rc may be located inside the gate electrode 2 as viewed from the normal direction of the substrate 1. Alternatively, a portion of the crystalline silicon region Rc may not overlap the gate electrode 2. For example, the entire semiconductor film may be crystallized by a laser annealing method which involves scanning the entire surface of a semiconductor film that is composed of amorphous silicon.

The present application is based on Japanese Patent Application No. 2018-123444, filed on Jun. 23, 2018, the entire disclosure of which is incorporated herein by reference.

What is claimed is:

1. A method of producing a thin film transistor, comprising:
   step (A) of providing a substrate, the substrate having formed on a surface thereof a gate electrode and a gate insulating layer covering the gate electrode;
   step (B) of forming a semiconductor film of amorphous silicon on the gate insulating layer;
   step (C) of forming an insulating film on the semiconductor film, and patterning the insulating film so as to form an insulating protection layer covering a first portion of the semiconductor film and not covering a second portion of the semiconductor film, when viewed from a normal direction of the substrate, the first portion overlapping the insulating protection layer and the gate electrode, and the second portion overlapping the gate electrode but not overlapping the insulating protection layer, the first portion including a region to become a channel region;
   step (D) of irradiating the first portion and the second portion of the semiconductor film with laser light from above the insulating protection layer under a same irradiation conditions to crystallize the first portion and the second portion of the semiconductor film so that, in a region overlapping the gate electrode as viewed from the normal direction of the substrate, the first portion of the semiconductor film has a crystallinity which is lower than a crystallinity of the second portion of the semiconductor film; and
   step (E) of forming a source electrode which is electrically connected to a part of the second portion of the semiconductor film and a drain electrode which is electrically connected to another part of the second portion of the semiconductor film.

2. The method of producing of claim 1, wherein the laser light has a wavelength of about 351 nm, and the insulating protection layer is a silicon oxide layer.

3. The method of producing of claim 1, wherein, in step (D), only a portion of the semiconductor film is irradiated with the laser light to be crystallized, while a portion of the semiconductor film that was not irradiated with the laser light is left amorphous.

4. The method of producing of claim 1, wherein a thickness of the insulating protection layer is set so that, in step (D), the first portion of the semiconductor film has an absorption rate of the laser light within a predetermined range containing a local minimum.

5. The method of producing of claim 4, wherein the thickness of the insulating protection layer is set so that, in step (D), the first portion and the second portion of the semiconductor film has an almost same absorption rate of the laser light.

* * * * *